(12) United States Patent
Adan

(10) Patent No.: US 6,515,560 B1
(45) Date of Patent: Feb. 4, 2003

(54) ACTIVE INDUCTOR

(75) Inventor: Alberto O. Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 68 days.

(21) Appl. No.: 09/775,587

(22) Filed: Feb. 5, 2001

(30) Foreign Application Priority Data

Feb. 21, 2000 (JP) ........................................ 2000-042949

(51) Int. Cl.$^7$ .............................................. H03H 11/48
(52) U.S. Cl. ...................................... 333/214; 333/215
(58) Field of Search ................................. 333/214, 215

(56) References Cited

U.S. PATENT DOCUMENTS 6,028,496 A * 2/2000 Ko et al. ..................... 333/214

FOREIGN PATENT DOCUMENTS

| JP | 63-219150 | 9/1988 |
| JP | 2-205107 | 8/1990 |
| JP | 8-181571 | 7/1996 |
| JP | 8-274584 | 10/1996 |

OTHER PUBLICATIONS

Thanachayanont, "A 1.5 V High–Q Comos Active Inductor for IF/RF Wireless Applications," Dec. 2000, IEEE, pp. 654–657.*

IEEE Transactions on Microwave Theory and Techniques, vol. 37, No. 12 (Dec. 1989), pp. 1979–1984.

"Q–Enhancing Technique for High Speed Active Inductors", XP 000592939, May 1994, Kaunisto et al., pp. 735–738.

"The Design of Active Floating Positive and Negative Inductors in MMIC Technology", XP 000525038, Oct. 1995, vol. 5, No. 10, pp. 321–323.

* cited by examiner

Primary Examiner—Justin P. Bettendorf
(74) Attorney, Agent, or Firm—Nixon & Vanderhye P.C.

(57) ABSTRACT

An active inductor includes an MOSFET having a gate, a drain serving as an output terminal and a grounded source, the MOSFET having a transconductance gm1, and a capacitor having opposite ends, one of which is grounded and the other of which is connected to the gate of the MOSFET and to a voltage-controlled constant current source having a transconductance gm, the capacitor having a capacitance C, the active inductor being operative with a small-signal output impedance Zo between the output terminal and the ground expressed as Zo=jω{C/(gm1·gm)} (wherein ω is an angular frequency) and with an inductance Leq expressed as Leq={C/(gm1·gm)}.

10 Claims, 3 Drawing Sheets

ACTIVE INDUCTOR

CROSS-REFERENCE TO RELATED APPLICATION

This application is related to Japanese patent application No. 2000-042949 filed on Feb. 21, 2000, whose priority is claimed under 35 USC §119, the disclosure of which is incorporated by reference in its entirety.

BACKGROUND OF THE INVENTION

1. Field of the Invention

The present invention relates to an active inductor and, more particularly, to an active inductor with its inductance electrically controllable, which comprises an MOSFET and a single capacitor for applications to RF (radio frequency) integrated circuits, high frequency VCOs and the like.

2. Description of the Prior Art

In general, inductors are implemented as passive elements employing metal spirals or bonding wires for use in filters, oscillators, RF tuned circuits and the like.

An active inductor with its inductance electrically controllable is disclosed in Japanese Unexamined Patent Publication No. Sho 63(1988)-219150 (Reference 1). The active inductor employs two cascade-connected FETs (field effect transistors) and a feedback resistor for suppression of a reduction in the inductance thereof and for size reduction thereof. This active inductor is also disclosed in IEEE Transactions on Microwave Theory and Techniques, Vol. 37, No. 12 (December 1989), pp. 1979–1984.

The active inductor (not shown) disclosed in Reference 1 has an output inductance Zo expressed as follows:

$$Zo \approx (1+j\omega \cdot Cgs \cdot R)/gm$$

wherein Cgs is the gate-source capacitance of the FETs, gm is the transconductance of the FETs, R is a feedback resistance, and ω is a resonant frequency. In the active inductor, the gate-source capacitance Cgs of the FETs serves to provide the inductance.

An active inductor disclosed in Japanese Unexamined Patent Publication No. Hei 2(1990)-205107 (Reference 2) is a modification of the active inductor of Reference 1, which employs an FET instead of the feedback resistor R. In this case, the feedback resistance R is expressed as R=1/gmf, wherein gmf is the transconductance of the feedback transistor.

An active inductor disclosed in Japanese Unexamined Patent Publication No. Hei 8(1996)-181571 (Reference 3) comprises three FETs and four capacitors C. The capacitors are used for DC isolation of the transistors.

An active inductor disclosed in Japanese Unexamined Patent Publication No. Hei 8(1996)-274584 (Reference 4) comprises a source-grounded FET, two cascade-connected FETs, three capacitors C and a resistor R.

In general, the high frequency operation range of an active inductor is limited by stray capacitances that resonate with an equivalent inductor.

FIG. 7(a) is a diagram illustrating a high frequency equivalent circuit of the active inductor, and FIG. 7(b) is a diagram illustrating an output impedance characteristic with respect to the frequency of the active inductor.

As shown in FIG. 7(b), a peak $Z_o$ in the output impedance characteristic is observed at a resonance frequency $\omega_o$, which is given by the following expression:

$$\omega_o = 1/(Leq \cdot Cp)^{1/2}$$

wherein Leq is an inductance, and Cp is a stray capacitance, which is expressed as follows for the circuit of Reference 1.

$$Cp = Cgs \cdot (\omega \cdot Cgs/gm)^2 + Cm$$

wherein Cm is a layout-dependent parasitic capacitance. The parasitic capacitance should be minimized to extend the frequency range of the inductor.

The active inductors having the circuit configurations of References 1 and 2 are problematic in that the inductance thereof is determined by the gate-source capacitance Cgs of the FETs.

The active inductors having the circuit configurations of References 3 and 4 are problematic in that the capacitors C should be additionally employed for DC isolation of the FETs. This results in complication and size increase of the circuits constituting the active inductors.

SUMMARY OF THE INVENTION

In view of the foregoing, the present invention is directed to an active inductor which comprises an MOSFET and a single capacitor and features a reduced size and an excellent frequency response characteristic as compared with the conventional active inductors.

In accordance with the present invention, there is provided an active inductor comprising: an MOSFET having a gate, a drain serving as an output terminal and a grounded source, the MOSFET having a transconductance gm1; and a capacitor having opposite ends, one of which is grounded and the other of which is connected to the gate of the MOSFET and to a voltage-controlled constant current source having a transconductance gm, the capacitor having a capacitance C; the active inductor being operative with a small-signal output impedance Zo between the output terminal and the ground expressed as Zo=jωG{C/(gm1·gm)} (wherein ω is an angular frequency) and with an inductance Leq expressed as Leq={C/(gm1·gm)}.

With this arrangement, the active inductor can have an excellent frequency response characteristic and a reduced size as compared with the conventional active inductors.

DETAILED DESCRIPTION OF THE PREFERRED EMBODIMENTS

Figure 1:
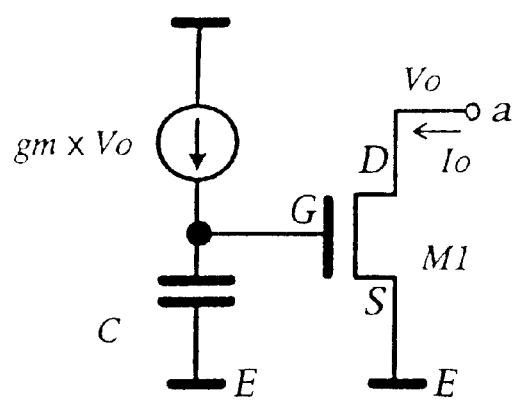
FIG. 1 is a diagram illustrating a basic circuit configuration to be employed in an active inductor according to the present invention.

An active inductor according to the present invention comprises an MOSFET having a gate, a drain serving as an output terminal and a grounded source, the MOSFET having a transconductance gm1; and a capacitor having opposite ends, one of which is grounded and the other of which is connected to the gate of the MOSFET and to a voltage-controlled constant current source having a transconductance gm, the capacitor having a capacitance C; the active inductor being operative with a small-signal output impedance Zo between the output terminal and the ground expressed as Zo=jω{C/(gm1·gm)} (wherein ω is an angular frequency) and with an inductance Leq expressed as Leq= {C/ (gm1·gm)}.

With this arrangement, the active inductor can have an excellent frequency response characteristic and a reduced size as compared with the conventional active inductors.

The inductance Leq may electrically be varied by adjusting the transconductance gm of the voltage-controlled constant current source.

The inductance Leq may electrically be varied by adjusting the transconductance gm1 of the MOSFET.

The voltage-controlled constant current source may comprise an NMOSFET and a PMOSFET cascade-connected to each other, and each having a gate, a drain and a source, the drain of the NMOSFET being kept at a fixed potential, the gate of the NMOSFET being connected to the drain of the MOSFET, the source of the NMOSFET being connected to the source of the PMOSFET, the gate of the PMOSFET being connected to a variable potential, the drain of the PMOSFET being connected to the gate of the MOSFET.

The voltage-controlled constant current source may comprise a PMOSFET having a source connected to the drain of the MOSFET, a gate connected to a variable potential, and a drain connected to the gate of the MOSFET.

The present invention further provides an active inductor, which comprises two NMOSFETs each having a gate, a drain serving as an output terminal and a grounded source; two PMOSFETs each having a gate, a drain and a source, the gates thereof being connected together to a DC potential; the sources thereof being respectively connected to the drains of the NMOSFETs; and a single capacitor having opposite ends respectively connected to the gates of the NMOSFETs.

The active inductor has an inductance which may electrically be varied by adjusting the transconductance of the two PMOSFETs.

The active inductor has an inductance which may electrically be varied by adjusting a DC voltage to be applied to the gates of the two PMOSFETs.

With reference to the attached drawings, the present invention will hereinafter be described in detail by way of examples thereof. It should be understood that the invention be not limited to these examples.

An explanation will be given to circuit configurations of several active inductors having more excellent frequency response characteristics than the conventional active inductors. With the circuit configurations herein explained, the inductance levels of the active inductors are determined by the transconductance of an MOSFET and the capacitance of a single capacitor.

FIG. 1 is a diagram illustrating a basic circuit configuration to be employed in an active inductor according to the present invention. The active inductor comprises an MOSFET M1, a capacitor C and a voltage-controlled constant current source which generates an electric current proportional to an output voltage Vo (I=gm·Vo).

The electric current Io is supplied to the capacitor C from the voltage-controlled constant current source, and determines the gate voltage V of the MOSFET. As a result, a small-signal output impedance Zo between a drain of the MOSFET M1 and the ground is given by the following expression:

$$Zo = Vo/Io = j\omega\{C/(gm1 \cdot gm)\}$$

wherein gm1 is the transconductance of the MOSFET, gm is the transconductance of the voltage-controlled constant current source, C is the capacitance of the capacitor, and ω is an operating angular frequency.

Figure 2:
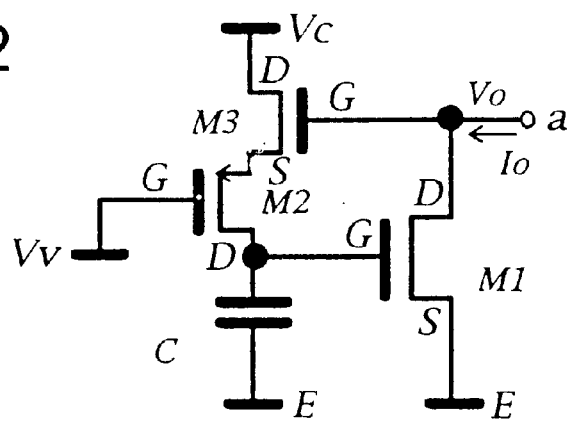
FIG. 2 is a diagram illustrating the circuit configuration of an active inductor according to Example 1 of the invention.

FIG. 2 is a diagram illustrating the circuit configuration of an active inductor according to Example 1 of the invention. This active inductor comprises three transistors including an MOSFET M1, a PMOSFET M2, and an NMOSFET M3, and a single capacitor C biased in saturation. A small-signal output impedance between a drain of the MOSFET M1 and the ground is expressed as follows:

$$Z = Vo/Io \approx j\omega\{C/(gm1 \cdot gm)\}$$

wherein gm=gm2·gm3/(gm2+gm3), gm1 is the transconductance of the MOSFET M1, gm2 is the transconductance of the PMOSFET M2, and gm3 is the transconductance of the NMOSFET M3.

A parasitic capacitance which limits the maximum operating range of this circuit is affected by the capacitance at an output node. A major contributor to the parasitic capacitance is the gate capacitance of the NMOSFET M3 for applications to high frequency (RF) circuits.

Figure 3:
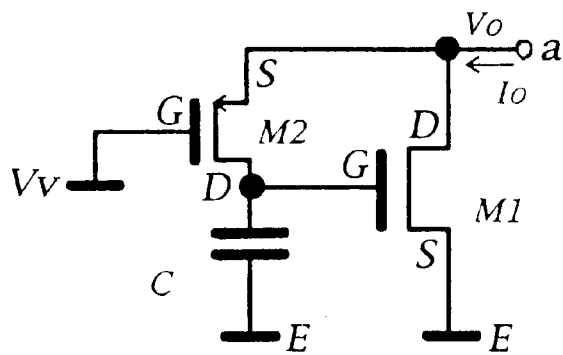
FIG. 3 is a diagram illustrating the circuit configuration of an active inductor according to Example 2 of the invention.

FIG. 3 is a diagram illustrating the circuit configuration of an active inductor according to Example 2 of the invention. This active inductor comprises two transistors including an MOSFET M1 and a PMOSFET M2, and a single capacitor. A small-signal output impedance Z between a drain of the MOSFET M1 and the ground is given by the following expression:

$$Z = Vo/Io \approx j\omega\{C/(gm1 \cdot gm)\}$$

With this circuit configuration, the output capacitance is determined by the source capacitance of the PMOSFET M2, which is much smaller than the gate capacitance of the NMOSFET M3 shown in FIG. 2. It is noted that in the figures, $V_c$ and $V_v$ represent constant voltages. In other words, for AC purposes, $V_c$ and $V_v$ may be considered ground potentials. From a DC standpoint, $V_c$ and $V_v$ may be bias voltages that can be adjusted to control transconductances of the transistors.

Figure 4:
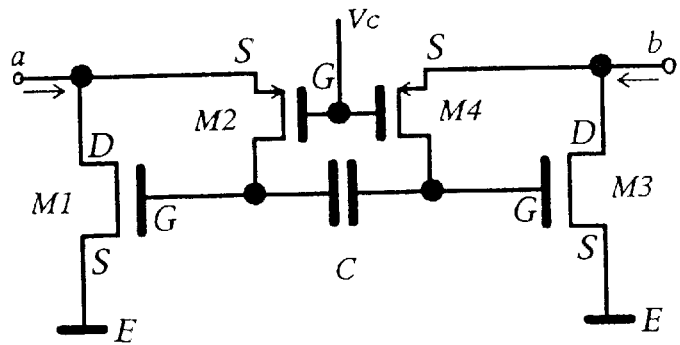
FIG. 4 is a diagram illustrating the circuit configuration of an active inductor according to Example 3 of the invention.

FIG. 4 is a diagram illustrating the circuit configuration of an active inductor according to Example 3 of the invention. This active inductor comprises four transistors including MOSFETs M1, M3 and PMOSFETs M2, M4, and a single capacitor. That is, a pair of circuits as shown in FIG. 3 are combined together to constitute a differential active inductor with a floating capacitor C.

This differential active inductor has an inductance which is electrically controllable by changing the transconductance of the MOSFET.

The active inductors according to the present invention can be implemented in any semiconductor integrated processes. However, the maximum operating frequency of any of these circuits of the active inductors is limited by the maximum operating frequency of the MOSFETs and parasitic capacitances. Therefore, a CMOS process with high frequency transistors (cut-off frequency ft: 20 GHz) is required for applications to high frequency circuits (e.g., RF to 2 GHz). Formation of a CMOS on an SOI (silicon-on-insulator) substrate is very advantageous in that source-drain junction capacitances are reduced.

Figure 5:
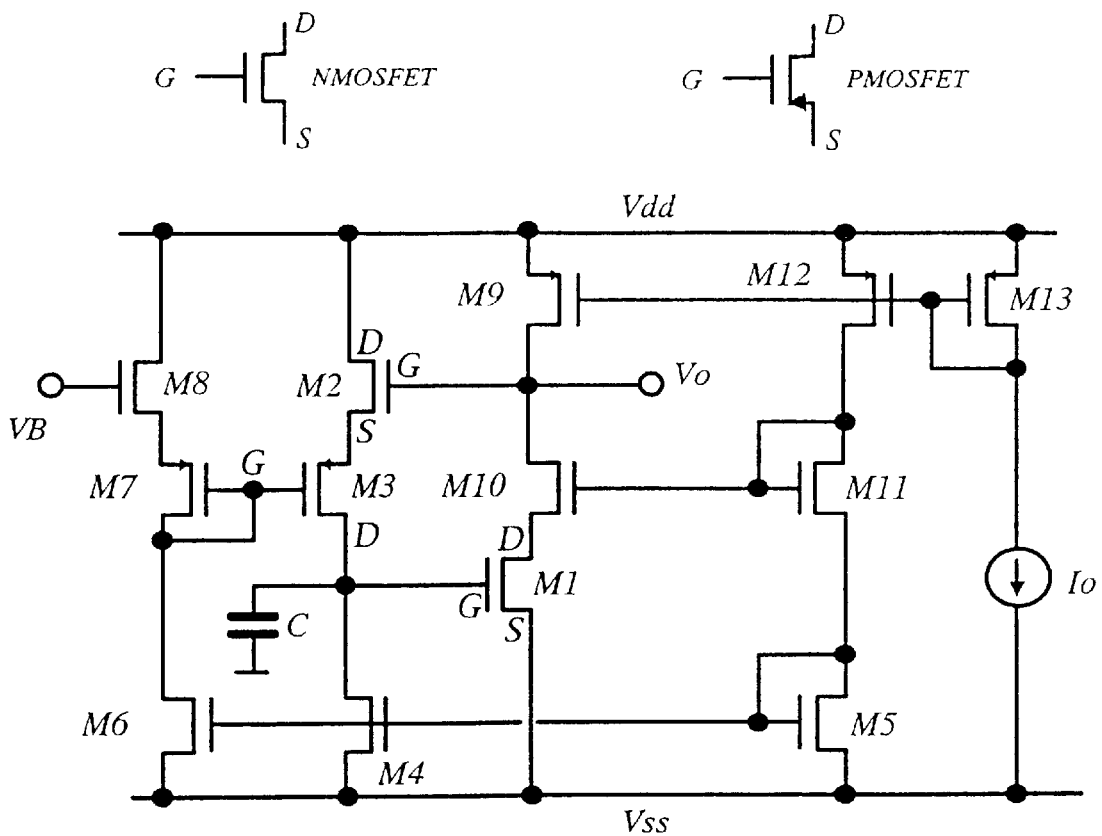
FIG. 5 is a diagram illustrating the circuit configuration of an active inductor according to Example 4 of the invention.

FIG. 5 is a diagram illustrating the circuit configuration of an active inductor according to Example 4 of the invention. The circuit configuration shown in FIG. 5 is a modification of the circuit configuration of FIG. 2, and includes a DC bias circuit. This active inductor comprises 13 transistors including NMOSFETs M1, M2, M4, M5, M6, M6, M8, M10, M11 and PMOSFETs M3, M7, M9, M12, M13, and a single capacitor.

The NMOSFETs M1, M2 and the PMOSFET M3 are core transistors (corresponding to the three MOSFETs shown in FIG. 2) which determine the inductance.

The NMOSFET M10 is cascade-connected in series to the NMOSFET M1 to increase its output resistance ro. The NMOSFET M4 is used to set the DC bias point of the NMOSFET M2 and the PMOSFET M3.

The PMOSFETs M12, M13 constitute a current mirror circuit to set the bias current via the NMOSFET M5 for the NMOSFETs M4, M6, and via the PMOSFET M9 for the NMOSFET M1. It is noted that Io is an external bias current.

At low frequencies, the drain-source resistance $rds_4$ of the NMOSFET M4 limits the output impedance. The output resistance ro of this circuit is given by the following expression:

$$ro \approx 1/(gm1 \cdot gm_{2,3} \cdot rds_4)$$

wherein $gm_{2,3}$ is the transconductance of the NMOSFET M2 and the PMOSFET M3 in combination.

The output node of the circuit is denoted by Vo. The circuit configuration shown in FIG. 5 is merely an example which may be employed for relatively low frequency applications, and all the bias transistor network is of course included for integration in a CMOS process. For simplification of the circuit, the bias circuit can also be implemented with the use of passive components (e.g., resistors).

Figure 6:
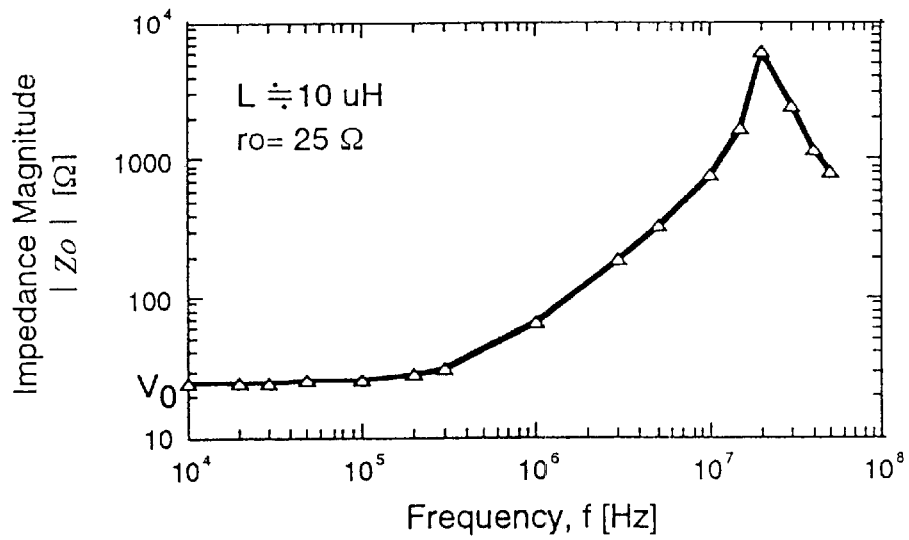
FIG. 6 is a graph illustrating an output impedance characteristic of the active inductor of Example 4 with respect to the frequency.
Figure 7:
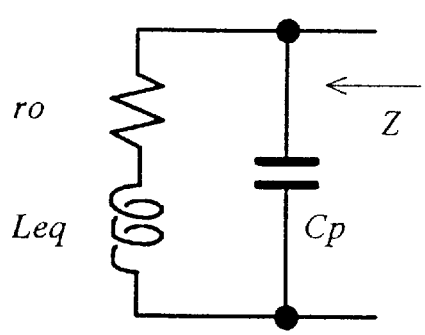
FIG. 7(a) is a diagram illustrating a high-frequency equivalent circuit of a conventional active inductor.
FIG. 7(b) is a graph illustrating an output impedance characteristic of the conventional active inductor.
Figure 7:
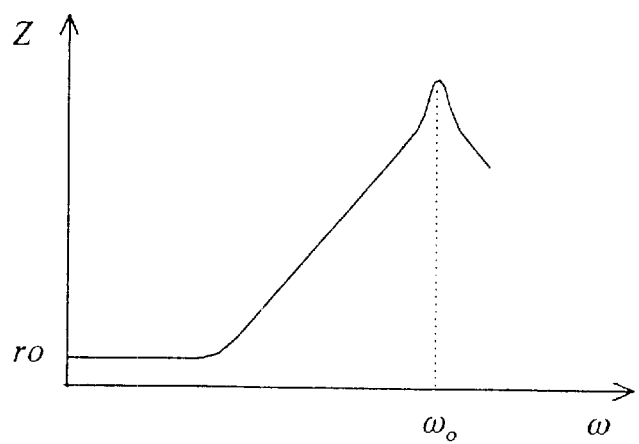

FIG. 6 is a graph illustrating an output impedance characteristic of the active inductor of Example 4 with respect to the frequency. The output impedance Zo (measured value) at the node Vo is shown as a function of the frequency.

The active inductor having the circuit configuration shown in FIG. 5 and the output impedance characteristic shown in FIG. 6 is designed to be operative with an inductance of L=10 µH. The circuit is implemented with the use of a capacitor having a capacitance of C=10 pF. As a result, a resonant peak is observed at $\omega_o \sim 20$ MHz. The output impedance Zo of the circuit is approximately 25Ω.

With this circuit configuration, the inductance is determined by the transconductance of the transistors, the bias current and the capacitance of the capacitor C. The formation of the capacitor C can be achieved by utilizing a double-polysilicon capacitor process.

The frequency response and the inductance are adjusted by changing the bias current Io.

The active inductors according to the present invention are each implemented by employing a circuit configuration including at least one MOSFET and a single capacitor C. As compared with the conventional circuit configurations and the conventional passive components for the inductors, the following effects are noted.
(1) The area of the circuit can be reduced as compared with passive components.
(2) The inductance can be increased.
(3) The inductance can electrically be varied. This is important for tuning and for correction for process fluctuations.
(4) The number of constituent components can be reduced.
(5) The operating frequency range can be extended by using high frequency MOS transistors and by using an SOI substrate for reduction of the parasitic capacitance.

The active inductors according to the present invention each have an excellent frequency response characteristic and a reduced size as compared with the conventional active inductors.

What is claimed is:

1. An active inductor comprising:
   an MOSFET having a gate, a drain serving as an output terminal and a grounded source, the MOSFET having a transconductance gm1; and
   a capacitor having opposite ends, one of which is grounded and the other end of which is connected to the gate of the MOSFET and to a voltage-controlled constant current source having a transconductance gm;
   the capacitor having a capacitance C, and wherein one terminal of the capacitor is connected to the gate of the MOSFET but not directly to the source or drain of the MOSFET;
   the active inductor being operative with a small-signal output impedance Zo between the output terminal and the ground expressed as Zo=jω{C/(gm1·gm)}, wherein ω is an angular frequency, and with an inductance Leq expressed as Leq={C/(gm1·gm)}.

2. An active inductor as set forth in claim 1, wherein the inductance Leq is electrically varied by adjusting the transconductance gm of the voltage-controlled constant current source.

3. An active inductor as set forth in claim 1, wherein the inductance Leq is electrically varied by adjusting the transconductance gm1 of the MOSFET.

4. An active inductor as set forth in claim 1, wherein the voltage-controlled constant current source comprises an NMOSFET and a PMOSFET cascode-connected to each other, and each having a gate, a drain and a source, the drain of the NMOSFET being kept at a fixed potential, the gate of the NMOSFET being connected to the drain of the MOSFET, the source of the NMOSFET being connected to the source of the PMOSFET, the gate of the PMOSFET being connected to a variable potential, the drain of the PMOSFET being connected to the gate of the MOSFET.

5. An active inductor as set forth in claim 1, wherein the voltage-controlled constant current source comprises a PMOSFET having a source connected to the drain of the MOSFET, a gate connected to a variable potential, and a drain connected to the gate of the MOSFET.

6. An active inductor comprising:
   two NMOSFETs each having a gate, a drain serving as an output terminal and a grounded source;
   two PMOSFETs each having a gate, a drain and a source, the gates thereof being connected together to a DC potential, the sources thereof being respectively connected to the drains of the NMOSFETs; and
   a single capacitor having opposite ends respectively connected to the gates of the NMOSFETs.

7. An active inductor as set forth in claim 6, which has an inductance which is electrically varied by adjusting a transconductance of the two PMOSFETs.

8. An active inductor as set forth in claim 6, which has an inductance which is electrically varied by adjusting a DC voltage to be applied to the gates of the two PMOSFETs.

9. An active inductor comprising:
   an MOSFET having a gate, a drain serving as an output terminal and a grounded source, the MOSFET having a transconductance gm1; and
   a capacitor having opposite ends, one of which is grounded with no transistor being provided between ground and the one end of the capacitor, and the other end of which is connected to the gate of the MOSFET and to a voltage-controlled constant current source having a transconductance gm;

the capacitor having a capacitance C, and wherein no part of the capacitor is made up by part of a transistor;

the active inductor being operative with a small-signal output impedance Zo between the output terminal and the ground expressed as Zo=j$\omega$\{C/(gm1·gm)\}, wherein $\omega$ is an angular frequency, and with an inductance Leq expressed as Leq=\{C/(gm1·gm)\}.

10. An active inductor comprising:

an MOSFET having a gate, a drain serving as an output terminal and a grounded source, the MOSFET having a transconductance gm1;

a capacitor having opposite ends, one of which is grounded and the other end of which is connected to the gate of the MOSFET and to a voltage-controlled constant current source having a transconductance gm;

the capacitor having a capacitance C; and the active inductor being operative with a small-signal output impedance Zo between the output terminal and the ground expressed as Zo=j$\omega$(C/(gm1·gm)), wherein $\omega$ is an angular frequency, and with an inductance Leq expressed as Leq=(C/(gm1·gm)).

* * * * *